(12) United States Patent
Mellinger et al.

(10) Patent No.: US 6,580,635 B1
(45) Date of Patent: Jun. 17, 2003

(54) BITLINE SPLITTER

(75) Inventors: Todd W. Mellinger, Fort Collins, CO (US); Jonathan E. Lachman, Fort Collins, CO (US); John Wuu, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/133,946

(22) Filed: Apr. 25, 2002

(51) Int. Cl.[7] ............................................... G11C 11/40
(52) U.S. Cl. .................. 365/156; 365/154; 365/189.11; 365/190
(58) Field of Search ................................ 365/154, 156, 365/189.11, 190

(56) References Cited

U.S. PATENT DOCUMENTS

| | | | | |
|---|---|---|---|---|
| 4,482,984 A | * | 11/1984 | Oritani ........................ | 365/154 |
| 6,084,810 A | * | 7/2000 | Storino et al. .............. | 365/204 |
| 6,366,504 B1 | * | 4/2002 | Masgonty et al. .......... | 365/154 |
| 6,477,098 B1 | * | 11/2002 | Raad ........................... | 365/190 |

* cited by examiner

*Primary Examiner*—Son Mai
(74) *Attorney, Agent, or Firm*—Alexander J. Neudeck

(57) ABSTRACT

During read operations of a column of RAM cells, a bitline is electrically broken into two sections. This reduces the capacitance that needs to be discharged by the RAM cell itself. A buffer is used during the read operation to relay data from one part of the split bitline to the other. A weak pullup path is also provided to hold the non-driven end of the line in a stable condition. During non-read operations, the two sections of bitline are electrically connected.

10 Claims, 1 Drawing Sheet

FIG. 1

BITLINE SPLITTER

FIELD OF THE INVENTION

This invention relates generally to electronic circuits and more particularly random access memory (SRAM) circuits.

SUMMARY OF THE INVENTION

During read operations, a bitline is electrically broken into two sections. This reduces the capacitance that needs to be discharged by the RAM cell itself. A—buffer is used during the read operation to relay data from one part of the split bitline to the other. A weak pullup path is also provided to hold the non-driven end of the line in a stable condition. During non-read operations, the two sections of bitline are electrically connected.

DETAILED DESCRIPTION OF THE PREFERRED EMBODIMENTS

Figure 1:
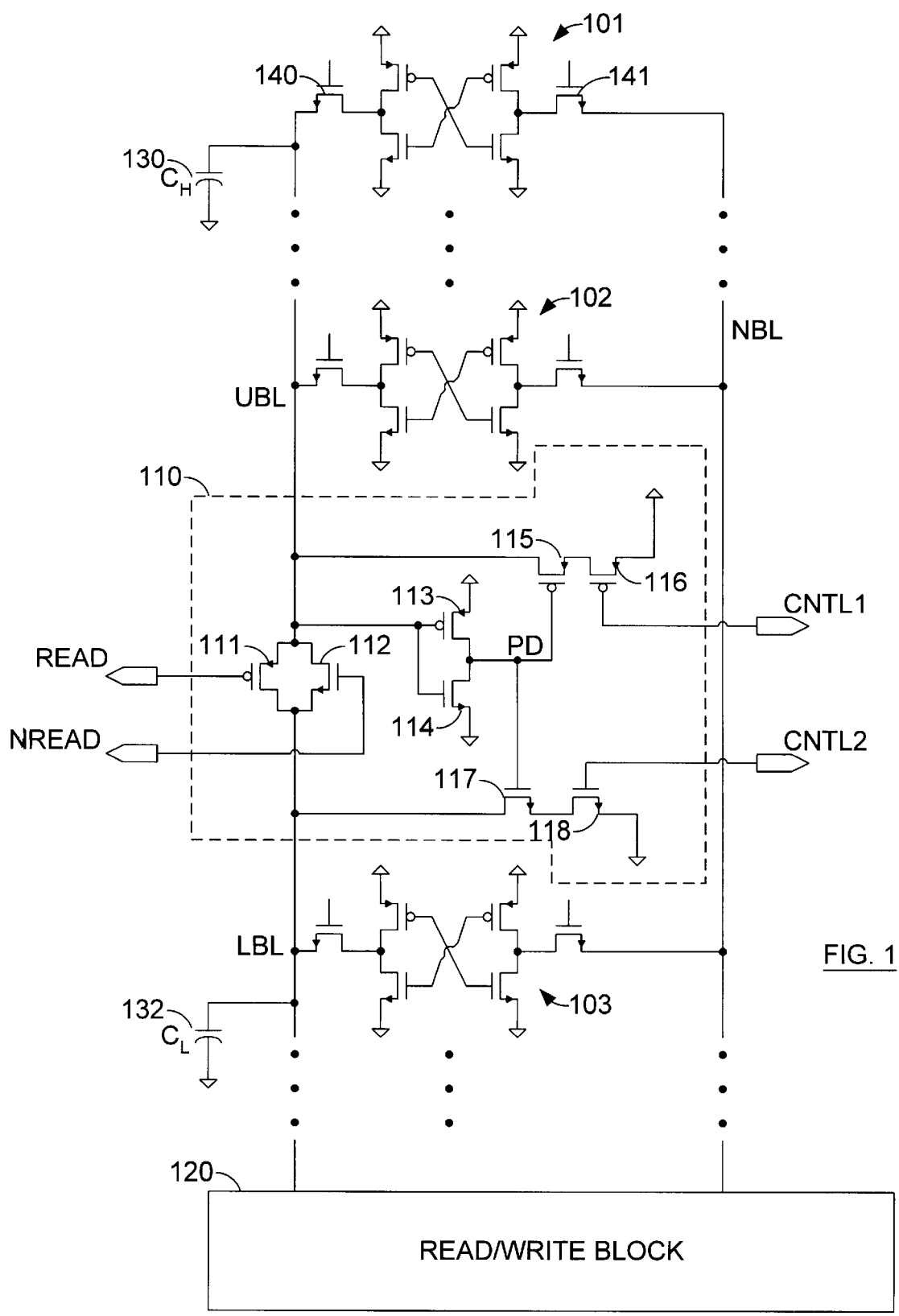
FIG. 1 is an illustration of a column of RAM cells with a bitline splitter.

FIG. 1 is an illustration of a column of RAM cells with a bitline splitter. In FIG. 1, static RAM cells 101, 102, 103 comprise a pair of cross-coupled CMOS inverters and two n-channel field-effect transistors (NFETs) pass-gates. The two NFET pass-gates are controlled by row select lines to either stay non-conducting, or to conduct. During a read operation, the pass-gates of a particular cell in a column are controlled to conduct thereby allowing a particular RAM cell 101, 102, 103 to dump its value (or its inverse) onto a bitline (NBL) or partial bitline (UBL, LBL) to be read by the read/write block. During a write operation, the pass-gates of a particular cell 101, 102, 103 in a column are controlled to conduct thereby allowing the read/write block 120 to set the cell by overdriving the previous contents of the cell via the bitlines (NBL, UBL, LBL). Capacitors 130 ($C_H$) (shown connected between UBL and the negative supply voltage) and 132 ($C_L$) (shown connected between LBL and the negative supply voltage) represent parasitic capacitances on UBL and LBL, respectively, and includes the trace wiring, gate-source capacitance, etc.

RAM cell 101 is shown in FIG. 1 with one of its NFET pass-gates connected to bitline NBL and the other to partial bitline UBL. Likewise, RAM cell 102 is shown with one of its NFET pass-gates connected to bitline NBL and the other to partial bitline UBL. These two RAM cells 101, 102 represent a plurality of RAM cells in a column all sharing the common bitlines UBL and NBL but being controlled by different row control lines. RAM cell 103 is shown in FIG. 1 with one of its NFET pass-gates connected to bitline NBL and the other to partial bitline LBL. RAM cell 103, represents a plurality of RAM cells in a column all sharing the common bitlines LBL and NBL but being controlled by different row control lines. Bitlines LBL and NBL connect to read/write block 120. Read/write block 120 contains the read sense amplifiers and write drive circuitry to read and write the RAM cells represented by 101, 102, and 103.

Box 110 encloses a bitline splitter. Bitline splitter 110 comprises a complementary pass-gate 111, 112, an inverting buffer 113, 114, pulldown 117, 118 and a weak pullup 115, 116. PFET 111 and NFET 112 form a complementary pass-gate. The source of PFET 111 and the drain of NFET 112 are connected to UBL. The drain of PFET 111 and the source of NFET 112 are connected to LBL. The gate of PFET 111 is connected to control signal READ. The gate of NFET 112 is connected to control signal NREAD. When appropriately controlled by READ and NREAD, the complementary pass-gate 111, 112 isolates UBL and LBL from each other during read operations. This isolation reduces the amount of capacitance a RAM cell 101, 102, or 103 needs to charge/discharge when dumping its contents to create a measurable voltage difference from $C_H+C_L$ to only one of $C_H$ or $C_L$. $C_H+C_L$ is the amount of capacitance a RAM cell 101, 102, or 103 would need to charge/discharge when dumping its contents if bitline splitter 110 were not used.

PFET 113 and NFET 114 form an inverting buffer. The gates of 113 and 114 are both connected to UBL. The source of PFET 113 is connected to the positive supply voltage. The drain of PFET 113 is connected to intermediate node, PD. The source of NFET 114 is connected to the negative supply voltage. The drain of NFET 114 is connected to intermediate node, PD.

PFETs 115 and 116 form a weak pullup. The drain of PFET 115 is connected to UBL. The gate of PFET 115 is connected to PD (and therefore, the drains of 113 and 114). The source of PFET 115 is connected to the drain of PFET 116. The gate of PFET 116 is connected to a control signal CNTL1. The source of PFET 116 is connected to the positive supply voltage.

NFETs 117 and 118 form a pulldown. The drain of NFET 117 is connected to LBL. The gate of NFET 117 is connected to PD (and therefore, the drains of 113 and 114). The source of NFET 117 is connected to the drain of NFET 118. The gate of NFET 118 is connected to a control signal CNTL2. The source of NFET 118 is connected to the negative supply voltage. Typically, NFET 117 and 118 would be sized relatively large compared to the NFETs in a RAM cell. This allows the combination of a reduced bitline capacitance being driven by the RAM cell (i.e. $C_H$ instead of $C_{H+}C_L$) and a rapid discharge path through NFETs 117, 118 to discharge LBL fast enough to more than make up for the propagation delay added by bitline splitter 110.

In normal operation, CNTL1 is low and CNTL2 is high during all operations. During all non-read operations, READ is low and NREAD is high electrically connecting UBL and LBL.

Before a read occurs, UBL and LBL are typically precharged high (i.e. to a logical "1"). When a read occurs, READ and NREAD turn 111 and 112 off (i.e. READ goes high and NREAD goes low). This isolates LBL and UBL. If a read of a zero (low) occurs on a cell connected to UBL (i.e. those cells represented by 101 and 102) UBL is discharged to a low. This causes buffer 113, 114 to drive PD high. When PD and CNTL2 are both high, pulldown 117, 118 quickly discharges LBL to a low. This low may then be read by read/write circuitry 120. If a read of a zero occurs on a cell connected to LBL (i.e. those cells represented by 103) LBL is discharged to a low. This low may be directly read by read/write block 120.

Control lines CNTL1 and CNTL2 are used to turn off weak pullup 115, 116 and pulldown 117, 118 during certain test conditions. If these test conditions are not needed, one or both FETs 116 and 118 may be eliminated. Weak pullup 115, 116 serves to hold UBL in its precharged state when a read of a cell connected to LBL occurs. NFET 115 in the weak pullup is controlled by PD so that a high state on UBL keeps the path through 115, and 116 on helping to hold UBL high. However, if UBL goes low, PD goes high, thereby turning 115 off and disabling the weak pullup path.

In FIG. 1, a bitline splitter 110 is shown splitting only one side of the bitlines connected to RAM cells 101, 102, 103. In another embodiment, a second bitline splitter could be added to split bitline NBL into two bitlines.

One advantage of splitting a bitline with bitline splitter 110 is that it facilitates single-ended reads. A single-ended read is a read that turns on only one of the pass-gates of a cell and therefore uses only one of the two bitlines connected to a cell. For example, a single-ended read of cell 101 may only turn on FET 141. This would require cell 101 to charge or discharge through FET 141 all of the parasitic capacitances connected to NBL until a reliably detectable voltage difference between the bitline voltage and a reference voltage is developed. In contrast, a differential read develops the voltage difference between the two bitlines so a smaller positive change on one line is added to a smaller negative change on the other to develop a reliably detectable voltage difference. However, with a bitline splitter inserted on the bitline, cell 101 only has to discharge either $C_H$ or $C_L$ to develop a reliably detectable voltage difference. Since single-ended reads are facilitated by bitline splitter(s), it is possible to perform two single-ended reads on one column. With appropriate control, this effectively makes a standard RAM cell able to function as a two-ported (for reading) RAM cell.

What is claimed is:

1. A column of RAM cells, comprising:
   a first plurality of RAM cells connected to a first bitline;
   a second plurality of RAM cells connected to a second bitline;
   a pass-gate separating said first bitline from said second bitline during a read operation; and,
   a pulldown controlled by a voltage on said first bitline that discharges said second bitline when said first bitline is discharged by one of said first plurality of RAM cells.

2. The column of RAM cells of claim 1, further comprising:
   a buffer having an input connected to said first bitline and an output that controls said pulldown.

3. The column of RAM cells of claim 2, further comprising:
   a weak pullup connected to said first bitline and controlled by said buffer to hold said first bitline at a known logic level when one of said second plurality of RAM cells is driving said second bitline.

4. A plurality of RAM cells coupled to a single read circuit, comprising:
   a first plurality of RAM cells connected to a first partial bitline;
   a second plurality of RAM cells connected to a second partial bitline;
   a buffer having an input connected to said first partial bitline and an output connected to said second partial bitline;
   a pass-gate connected to said first partial bitline and said second partial bitline and controlled to isolate said first partial bitline and said second partial bitline during read operations and electrically connect said first partial bitline and said second partial bitline during other operations.

5. The plurality of RAM cells of claim 4, further comprising:
   a pullup connected to said first partial bitline and controlled by a voltage on said first partial bitline to hold said first partial bitline at a selected voltage level when none of said first plurality of RAM cells is driving said first partial bitline.

6. A column of RAM cells, comprising:
   a plurality of RAM cells each having a means for discharging a precharged bitline;
   means for electrically separating said precharged bitline into at least a first and a second partial bitline, said first partial bitline connected to said means for discharging of a first plurality of RAM cells and said second partial bitline connected to said means for discharging of a second plurality of RAM cells;
   means for discharging said second partial bitline when said first partial bitline is discharged by one of said means for discharging of said first plurality of RAM cells.

7. The column of RAM cells of claim 6, further comprising:
   means for holding said first partial bitline in an undischarged state if none of said first means for discharging of said first plurality of RAM cells actively discharges said first partial bitline.

8. A method of reading one of a plurality of RAM cells coupled to a single read circuit, comprising:
   electrically isolating a bitline into a first partial bitline and a second partial bitline;
   relaying a discharging state from said first partial bitline to said second partial bitline to discharge said second partial bitline when a RAM cell is discharging said first partial bitline;
   holding a non-discharging state on said first partial bitline when said RAM cell is not discharging said first partial bitline;
   electrically connecting said first partial bitline and said second partial bitline to form said bitline.

9. The method of claim 8, further comprising:
   disabling said relaying.

10. The method of claim 9, further comprising:
    disabling said holding.

* * * * *